United States Patent
Kagase (10) Patent No.: US 11,099,683 B1
(45) Date of Patent: Aug. 24, 2021

(54) TOUCH PANEL, TOUCH PANEL MODULE, AND METHOD FOR INSPECTING TOUCH PANEL

(71) Applicant: NISSHA CO., LTD., Kyoto (JP)

(72) Inventor: Mitsuru Kagase, Kyoto (JP)

(73) Assignee: NISSHA CO., LTD., Kyoto (JP)

( * ) Notice: Subject to any disclaimer, the term of this patent is extended or adjusted under 35 U.S.C. 154(b) by 0 days.

(21) Appl. No.: 17/268,055

(22) PCT Filed: Nov. 18, 2019

(86) PCT No.: PCT/JP2019/045027
§ 371 (c)(1),
(2) Date: Feb. 11, 2021

(87) PCT Pub. No.: WO2020/129506
PCT Pub. Date: Jun. 25, 2020

(30) Foreign Application Priority Data

Dec. 19, 2018 (JP) .............................. JP2018-237793

(51) Int. Cl.
*G06F 3/041* (2006.01)
*G06F 3/044* (2006.01)

(52) U.S. Cl.
CPC ........ *G06F 3/04164* (2019.05); *G06F 3/0446* (2019.05)

(58) Field of Classification Search
CPC .......................... G06F 3/04164; G06F 3/0446
See application file for complete search history.

(56) References Cited

U.S. PATENT DOCUMENTS

| | | | | |
|---|---|---|---|---|
| 7,746,086 B2* | 6/2010 | Eun | ..................... | G01R 31/2812 324/713 |
| 2002/0180454 A1* | 12/2002 | Okano | ............... | G01R 1/06794 324/529 |
| 2003/0199111 A1* | 10/2003 | Hamamura | ........ | G01R 31/2818 438/17 |
| 2008/0018338 A1* | 1/2008 | Eun | ........................ | G01R 31/50 324/509 |
| 2011/0261010 A1* | 10/2011 | Nishitani | .............. | G06F 3/0445 345/174 |

(Continued)

FOREIGN PATENT DOCUMENTS

| | | |
|---|---|---|
| JP | 2012208732 A | 10/2012 |
| JP | 2016053787 A | 4/2016 |
| WO | 2012144434 A1 | 10/2012 |

*Primary Examiner* — Amy Onyekaba
(74) *Attorney, Agent, or Firm* — Alleman Hall Creasman & Tuttle LLP (57) ABSTRACT

A touch panel includes a substrate having insulating properties and including a sensing region and a non-sensing region, a plurality of sensor electrodes formed in the sensing region, a plurality of external connection terminals formed in the non-sensing region, and a lead-out wiring line electrically connecting one end of each of the plurality of sensor electrodes to each of the plurality of external connection terminals. The external connection terminal and the lead-out wiring line are continuously divided by a single slit along an extension direction of the external connection terminal and the lead-out wiring line in an entire length, or in a portion of the entire length from which an end portion in a sensor electrode side of the lead-out wiring line is excluded.

13 Claims, 4 Drawing Sheets

(56) References Cited

U.S. PATENT DOCUMENTS

| | | | |
|---|---|---|---|
| 2012/0229395 A1* | 9/2012 | Shin | G06F 3/0446 |
| | | | 345/173 |
| 2012/0247938 A1* | 10/2012 | Saito | G06F 3/0445 |
| | | | 200/600 |
| 2012/0287079 A1* | 11/2012 | Sato | G06F 3/0445 |
| | | | 345/174 |
| 2014/0191930 A1* | 7/2014 | Okumoto | G09G 3/006 |
| | | | 345/55 |
| 2014/0320760 A1* | 10/2014 | Ishizaki | G06F 3/0445 |
| | | | 349/12 |
| 2016/0357308 A1* | 12/2016 | Li | G02F 1/13439 |
| 2017/0156218 A1* | 6/2017 | Kogawa | H05K 3/28 |
| 2017/0177120 A1* | 6/2017 | Kyutoku | G06F 3/041 |
| 2018/0032190 A1* | 2/2018 | Koide | G06F 3/0446 |
| 2018/0246601 A1* | 8/2018 | Kurasawa | G06F 3/0446 |
| 2020/0333937 A1* | 10/2020 | Motonishi | H01R 12/62 |

* cited by examiner

TOUCH PANEL, TOUCH PANEL MODULE, AND METHOD FOR INSPECTING TOUCH PANEL

CROSS REFERENCES TO RELATED APPLICATIONS

This application is a U.S national phase of International Application No. PCT/JP2019/045027, filed on Nov. 18, 2019, which claims priority to Japanese Patent Application No. 2018-237793, filed on Dec. 19, 2018, each of which is incorporated herein by reference for all purposes.

TECHNICAL FIELD

The present disclosure relates to a touch panel, a touch panel module, and a method for inspecting a touch panel.

BACKGROUND

A touch panel enables operation of a device by touching a pattern such as a figure and a letter displayed on a screen with a finger or a pen. In recent years, the touch panel has been essential to a display device, mainly particularly in a mobile device.

Figure 1:
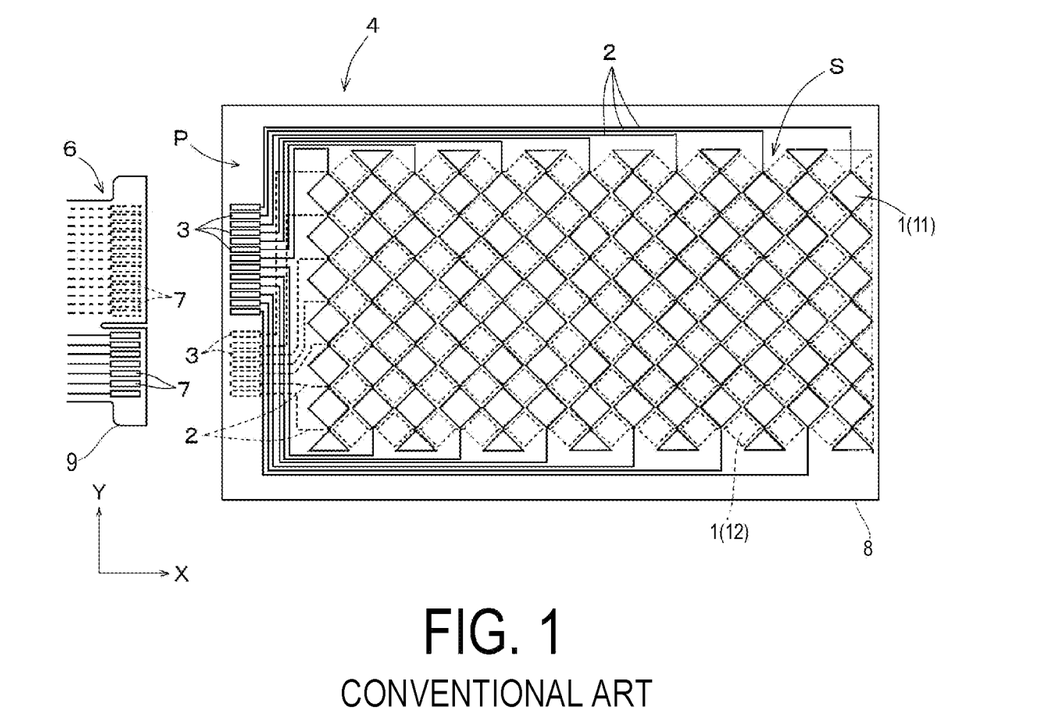
FIG. 1 is an explanatory view illustrating an example of a typical capacitive touch panel and an FPC for external connection.

FIG. 1 is an explanatory view illustrating an example of a typical capacitive touch panel and a flexible printed circuit (FPC) for external connection.

In a touch panel 4, a plurality of X electrodes 11 extending in a Y direction and arranged in an X direction, and a plurality of Y electrodes 12 extending in the X direction and arranged in the Y direction are disposed in an insulated state from each other on a substrate 8. Each of the electrodes is an electrode that is subjected to capacitance between the electrodes or a change of an electric field during touching. In FIG. 1, the plurality of X electrodes 11 is formed in a front surface side of the substrate 8, and the plurality of Y electrodes 12 is formed in a back surface side of the substrate 8. The both electrodes are both insulated by a transparent substrate sheet 8.

In the touch panel 4, a sensing region S is formed by a matrix of the plurality of X electrodes 11 and the plurality of Y electrodes 12, and the region is touched and thus input is performed.

In a non-sensing region P provided around the sensing region S of the touch panel 4, a plurality of external connection terminals 3 is formed, and one end of each of the plurality of X electrodes 11 and each of the plurality of Y electrodes 12 (herein, referred to collectively as sensor electrodes 1) and each of the external connection terminals 3 are electrically connected by a lead-out wiring line 2 (see FIG. 1). As illustrated in FIG. 1, a plurality of the lead-out wiring lines 2 is collectively provided, and thus the formation width is very small as compared with the formation width of each of the sensor electrodes 1.

Figure 7:
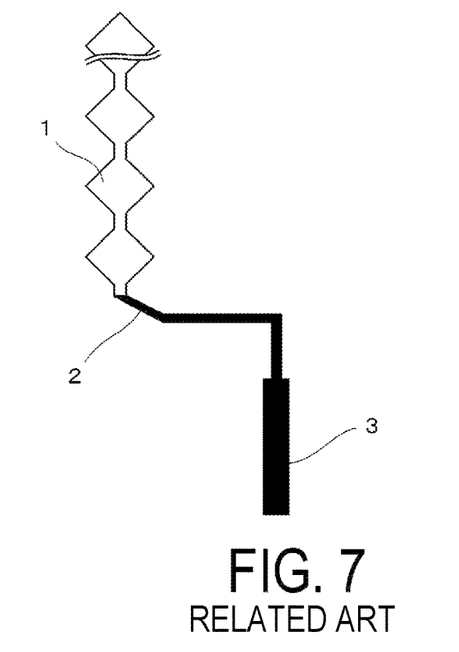
FIG. 7 is a schematic view illustrating a connection state of a lead-out wiring line and an external connection terminal for each sensor electrode in a touch panel 4 according to the related art.

FIG. 7 is a schematic view illustrating a connection state of a lead-out wiring line 2 and an external connection terminal 3 for each sensor electrode 1 in a touch panel 4 according to the related art, and the dimensions of a portion are indicated in an exaggerated manner. In FIG. 7, the single lead-out wiring line 2 and the single external connection terminal 3 are connected to a single line of the sensor electrodes 1.

In detection of a defect of such a touch panel 4, for example, an in-depth probe (also referred to as a probe) is brought into contact with an end portion in a side not connected to the lead-out wiring line 2 of the sensor electrode 1, and the external connection terminal 3, and continuity inspection is performed (see Patent Document 1). In a case where the inspection is satisfactory, the touch panel 4 is shipped as is, or the touch panel 4 is crimped with an FPC 6 to form a touch panel module, and then the touch panel module is shipped.

CITATION LIST

Patent Literature

Patent Document 1: JP 2012-208732 A

SUMMARY OF INVENTION

Problems to be Solved by the Present Disclosure

Figure 8:
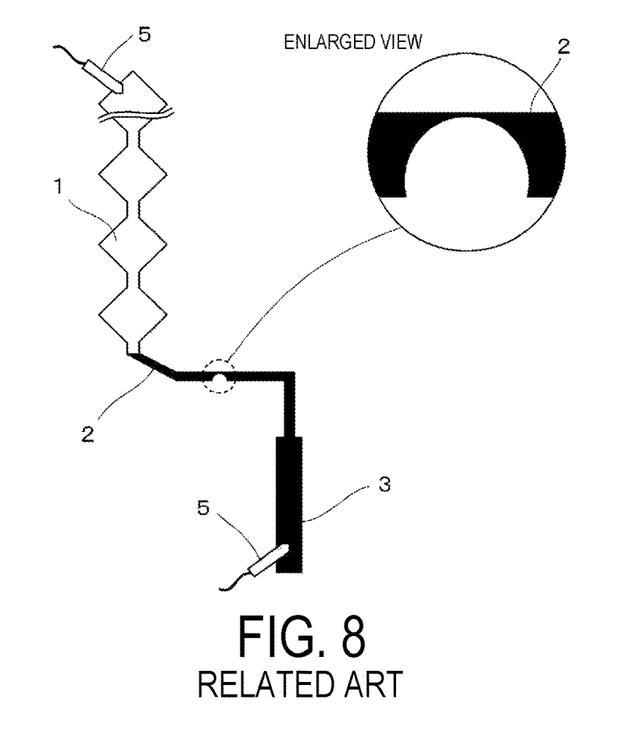
FIG. 8 is a schematic view illustrating an example of a method for inspecting a touch panel according to the related art.

However, in a method for inspecting a touch panel according to the related art, there has been a problem in a case where the lead-out wiring line 2 has a partial disconnection (see FIG. 8). Here, the "partial disconnection" refers to a state in which a portion of a wiring line remains in a contact state, or to a state in which although a wiring line is not completely disconnected, a portion of the wiring line is disconnected.

In a case where the lead-out wiring line 2 has the partial disconnection, a touch panel is not detected as a defective product in inspection. Accordingly, for example, when stress such as bending is applied in a subsequent step and the lead-out wiring line 2 is completely disconnected, then, the lead-out wiring line 2 is determined as a defective product (progressive defect).

Therefore, an object of the present disclosure is to provide a touch panel, a touch panel module, and a method for inspecting a touch panel that enable easy detection in inspection of a touch panel of a defect of a lead-out wiring line having a possibility that a change from a partial disconnection to a complete disconnection in the step subsequent to inspection.

Features for Solving the Problems

Some aspects will be described below as means to solve the problems. These aspects can be combined arbitrarily as necessary.

A touch panel of the present disclosure includes a substrate having insulating properties and including a sensing region and a non-sensing region around the sensing region, a plurality of sensor electrodes formed in the sensing region, a plurality of external connection terminals formed in the non-sensing region, and a lead-out wiring line electrically connecting one end of each of the plurality of sensor electrodes to each of the plurality of external connection terminals. The external connection terminal and the lead-out wiring line are continuously divided by a single slit along an extension direction of the external connection terminal and the lead-out wiring line in an entire length or in a portion of the entire length from which an end portion in a sensor electrode side of the lead-out wiring line is excluded.

According to such a configuration, a defect of a lead-out wiring line having a possibility of a partial disconnection changing to a complete disconnection in the step subsequent to inspection can be detected easily by continuity inspection.

Specifically, a probe of a continuity inspection device is brought into contact with each of a pair of split terminals including the external connection terminal divided, and continuity between the split terminals via a pair of split wiring lines including the lead-out wiring line divided, and via the sensor electrode is inspected.

In a case where only one of the pair of split wiring lines is completely disconnected, the lead-out wiring line as a whole is not completely disconnected but is not in a conducting state in the continuity inspection. Thus, a touch panel can be detected as a defective product having a high possibility of a partial disconnection changing to a complete disconnection in the step subsequent to the inspection.

Note that in the touch panel of the present disclosure, the plurality of sensor electrodes may include a plurality of first electrodes extending in a first direction and arranged in a second direction intersecting the first direction, and a plurality of second electrodes extending in the second direction and arranged in the first direction. Each of the plurality of first electrodes may be connected to the external connection terminal and the lead-out wiring line for each of the electrodes, and each of the plurality of second electrodes may be connected to the external connection terminal and the lead-out wiring line for each of the electrodes.

Additionally, in the touch panel of the present disclosure, the plurality of external connection terminals may be formed in one surface or both surfaces of the substrate.

Additionally, in the touch panel of the present disclosure, the slit may extend into the sensor electrode in a range where the slit does not completely divide the sensor electrode.

Additionally, a touch panel module of the present disclosure includes a substrate having insulating properties and including a sensing region and a non-sensing region around the sensing region, a plurality of sensor electrodes formed in the sensing region, a plurality of external connection terminals formed in the non-sensing region, a lead-out wiring line electrically connecting one end of each of the plurality of sensor electrodes to each of the plurality of external connection terminals, and an FPC crimped with the plurality of external connection terminals and including a plurality of FPC wiring lines. The external connection terminal and the lead-out wiring line are continuously divided by a single slit along an extension direction of the external connection terminal and the lead-out wiring line in an entire length or in a portion of the entire length from which an end portion in a sensor electrode side of the lead-out wiring line is excluded. The plurality of FPC wiring lines of the FPC are connected to the plurality of external connection terminals while extending across both sides of the slit.

According to such a configuration, the FPC wiring lines are connected to the external connection terminals while extending across both the sides of the slit. Accordingly, the external connection terminal and the lead-out wiring line function in the same manner as in a case where the external connection terminal and the lead-out wiring line are not divided.

Additionally, even in a case where a product determined as a good product in the continuity inspection has the partial discontinuity of only one of the pair of split wiring lines that changes to the complete disconnection after the inspection, the other of the pair of split wiring lines still remains, and thus a touch panel function can be maintained.

Advantageous Effects of Disclosure

A touch panel, a touch panel module, and a method for inspecting a touch panel according to the present disclosure enable easy detection in inspection of a touch panel of a defect of a lead-out wiring line having a possibility of a partial disconnection changing to a complete disconnection in a step subsequent to inspection.

DETAILED DESCRIPTION

Embodiments will be described below with reference to the drawings. To facilitate understanding of the present disclosure, in each of the figures referred to herein, some of components are schematically represented in such a way that the components are illustrated in an exaggerated manner. Accordingly, dimensions, ratios, and the like between components may be different from those of real objects. Additionally, dimensions, materials, shapes, relative positions, and the like of members and portions described in examples of the present disclosure are not intended to limit the scope of the invention to only those dimensions, materials, shapes, relative positions, and the like unless otherwise specified, and are merely an example for explanation.

1. First Embodiment

Touch Panel

FIG. 1 is an explanatory view illustrating an example of a typical capacitive touch panel and an FPC for external connection. In the present embodiment, a basic configuration as a capacitive touch panel is also the same. Since a constituent that is a feature of the present disclosure has a fine pattern, the constituent is not illustrated in FIG. 1.

A touch panel 4 according to the present embodiment includes a substrate 8 having insulation properties and including a sensing region S and a non-sensing region P around the sensing region S, a plurality of sensor electrodes 1 formed in the sensing region S, a plurality of external connection terminals 3 formed in the non-sensing region P, and a lead-out wiring line 2 that electrically connects one end of each of the sensor electrodes 1 to each of the external connection terminals 3.

For example, a resin film or a glass plate can be used as the substrate 8. When a resin film is used, examples of a material of the resin film can include acrylic, polycarbonate, polyethylene terephthalate, and a cycloolefin polymer.

The plurality of sensor electrodes 1 includes a plurality of first electrodes 11 extending in a first direction and arranged in a second direction intersecting the first direction, and a plurality of second electrodes 12 extending in the second direction and arranged in the first direction. In FIG. 1, the plurality of sensor electrodes includes a plurality of X electrodes 11 extending in a Y direction and arranged in an X direction, and a plurality of Y electrodes 12 extending in the X direction and arranged in the Y direction.

In the present embodiment, the X electrodes 11 are formed in a front surface side of the substrate 8 and are illustrated by solid lines. Additionally, the Y electrodes 12 are formed in a back surface side of the substrate 8 and are illustrated by dashed lines. All of the sensor electrodes 1 (the X electrodes 11 and the Y electrodes 12) include a plurality of island-shaped electrodes disposed along one direction, and connecting portions connecting the adjacent island-shaped electrodes. The island electrodes and the connecting portions are continuously and integrally formed.

The sensor electrodes 1 can be made of a material having conductivity and may be transparent or opaque. A transparent conductive oxide such as indium tin oxide (ITO) and tin zinc oxide (TZO), a conductive polymer such as polyethylenedioxythiophene (PEDOT), or the like can be used as the material having conductivity. In this case, the above-described electrodes can be formed by using vapor deposition, screen printing, or the like. Additionally, a conductive metal such as copper or silver may be used as the material having conductivity. In this case, the above-described electrodes may be formed by vapor deposition, or may be formed by using metallic paste such as copper paste and silver paste. Further, a conductive material such as carbon nanotube, metallic particles, or metallic nanofiber dispersed in a binder may be used as the material having conductivity.

The sensing region S is a region to be detected when a finger or a pen comes into contact with the touch panel 1. That is, a region where the sensor electrodes 1 (the X electrodes 11 and the Y electrodes 12) are formed is the sensing region. In FIG. 1, a rectangular region surrounding the X electrodes 11 and the Y electrodes 12 is defined as the sensing region S. The sensing region S is not limited to a rectangular region, and can be formed in any shape. Additionally, the sensing region may be a discontinuous region.

In FIG. 1, the non-sensing region P is disposed in contact with three sides of the sensing region S. However, the non-sensing region P may be disposed in any manner. For example, the non-sensing region P may be disposed around four sides of the sensing region S. The non-sensing region P may be disposed in contact with one side or two sides of the sensing region S.

Figure 2:
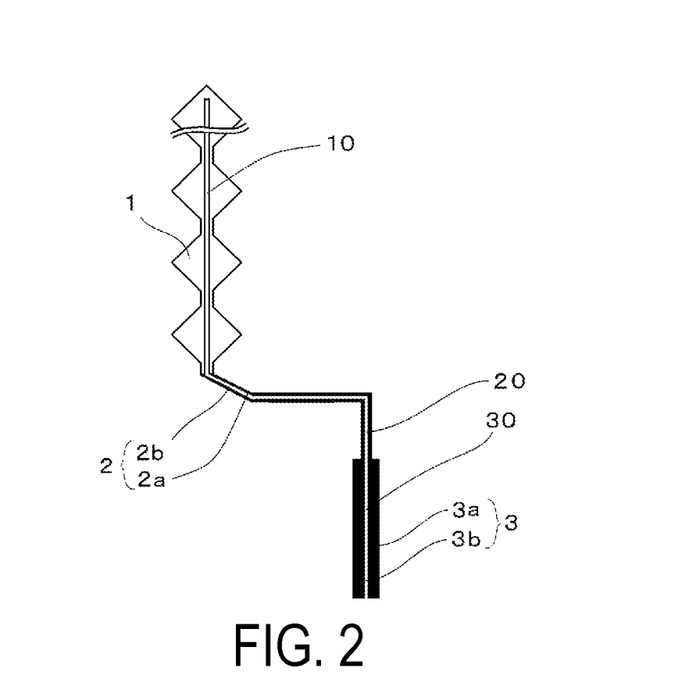
FIG. 2 is a schematic view illustrating an example of a connection state of a lead-out wiring line and an external connection terminal for each sensor electrode in a touch panel according to the present disclosure.

FIG. 2 is a schematic view illustrating an example of a connection state of a lead-out wiring line and an external connection terminal for each sensor electrode in the touch panel according to the present disclosure.

The single sensor electrode 1 (the X electrode 11 and the Y electrode 12) is extracted, and a connection relationship between the lead-out wiring line 2 and the external connection terminal 3 is the same in all of the sensor electrodes 1.

A conductive metal such as copper or silver can be used as a material of the lead-out wiring line 2 and the external connection terminal 3. In this case, the lead-out wiring line 2 and the external connection terminal 3 may be formed by vapor deposition, or may be formed by using metal paste such as copper paste and silver paste. Further, a conductive material such as carbon nanotube, metallic particles, or metallic nanofiber dispersed in a binder may be used as a material of the lead-out wiring line 2 and the external connection terminal 3.

The lead-out wiring line 2 and the external connection terminal 3 may each include a two-layer structure. In this case, the same material as the material of the sensor electrode 1 is used for a material of a lower layer, and the lower layers of the lead-out wiring line 2 and the external connection terminal 3, and the sensor electrode 1 may be formed at the same time.

As illustrated in FIG. 2, the external connection terminal 3 and the lead-out wiring line 2 are continuously divided by a single slit 20, 30 along the extension direction of the external connection terminal 3 and the lead-out wiring line 2 in the entire length.

That is, the lead-out wiring line 2 is completely divided, and a pair of split wiring lines 2a, 2b that is independent is configured. Additionally, the external connection terminal 3 is divided, and a pair of split terminals 3a, 3b is configured. Further, a slit 10 extends into the sensor electrode 1 in a range where the slit 10 does not completely divide the sensor electrode 1.

Method for Inspecting Touch Panel

Figure 3:
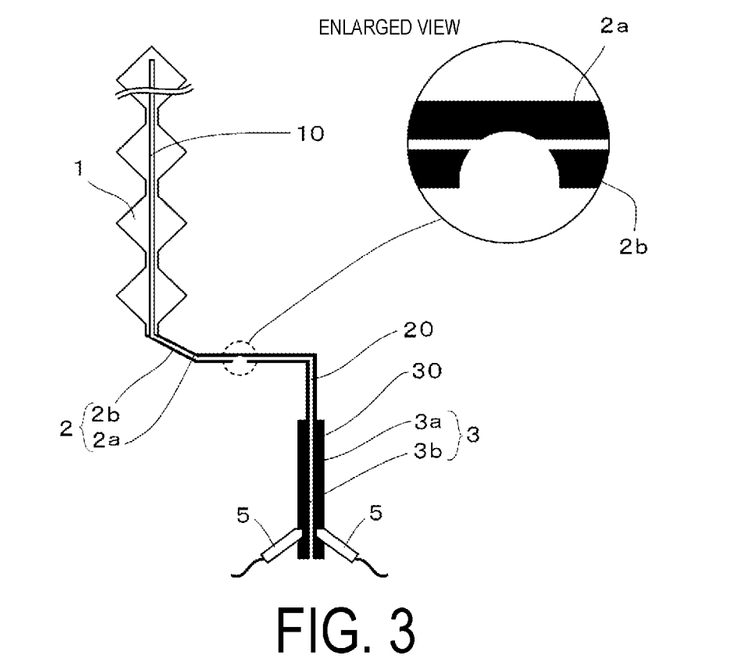
FIG. 3 is a schematic view illustrating an example of a method for inspecting a touch panel according to the present disclosure.

A schematic view illustrating an example of a method for inspecting a touch panel according to the present disclosure is presented.

For the above-described touch panel 4, a probe 5 of a continuity inspection device (not illustrated) is brought into contact with each of the pair of split terminals 3a, 3b dividing the external connection terminal 3, and continuity between the split terminals 3a, 3b via the pair of split wiring lines 2a, 2b dividing the lead-out wiring line 2, and via the sensor electrode 1 is inspected.

At this time, in a case where only the split wiring line 2b of the pair of split wiring lines 2a, 2b is completely disconnected as in an enlarged portion indicated by a circle in FIG. 3, the lead-out wiring line 2 as a whole is not completely disconnected but is not in a conducting state in the continuity inspection. Thus, the touch panel can be detected as a progressive defective product having a possibility of a partial disconnection changing to a complete disconnection in the step subsequent to inspection.

Note that the above-described touch panel 4 used in the inspection method does not need a wiring line dedicated to inspection, and thus an extra space is not required, and downsizing can be achieved. Additionally, the step of removing a wiring line dedicated to inspection after inspection is also unnecessary.

Touch Panel Module

After the above-described inspection of the touch panel is performed to remove a defective product, an FPC 6 is crimped with the external connection terminals 3 of the touch panel 4, and thus a touch panel module is obtained. An anisotropic conductive film (not illustrated) is used for connecting the FPC 6 to the external connection terminals 3 of the touch panel 4.

The FPC 6 includes a plurality of FPC wiring lines 7 (see FIG. 1). The FPC 6 is a highly reliable and highly flexible printed circuit board in which the plurality of FPC wiring lines 7 made of copper or the like is formed on a flexible film base material 9 such as a polyimide film or a polyester film. The FPC 6 has characteristics of, for example, being freely bendable, having high crease performance, being foldable and windable, having a high tear resistance and wiring density, and having a light weight and a small thickness.

In the anisotropic conductive film (not illustrated), conductive particles are dispersed in an adhesive (resin) that is cured by heat or light. The connection wiring lines 3 and the FPC wiring lines 7 of the FPC 6 are electrically connected by conductive particles.

In FIG. 1, the flexible film base material 9 of the FPC 6 is divided into two sections. The FPC wiring lines 7 are formed in a front surface of one of the two sections. The FPC wiring lines 7 are formed in a back surface of the other of the two sections. Note that the FPC 6 may be prepared as two FPCs 6 one of which includes the FPC wiring lines 7 formed in a front surface of the flexible film base material 9 and the other of which includes the FPC wiring lines 7 formed in a back surface of the flexible film base material 9.

Figure 4:
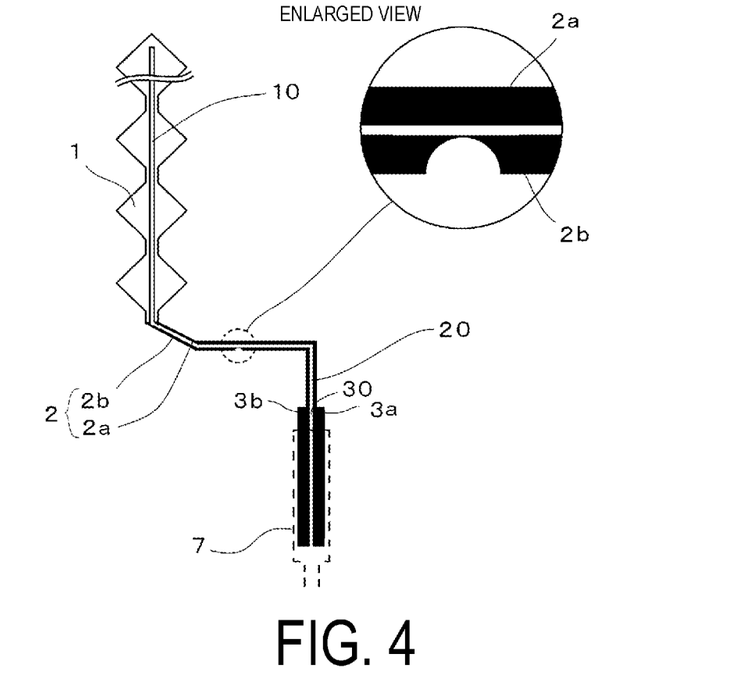
FIG. 4 is a schematic view illustrating an example of a crimped state of an FPC wiring line in a touch panel module according to the present disclosure.

FIG. 4 is a schematic view illustrating an example of a crimped state of the FPC wiring line in the touch panel module according to the present disclosure.

Only one line including one of the sensor electrodes 1, one of the lead-out wiring lines 2, and one of the external connection terminals 3 of the touch panel 4, and one of the FPC wiring lines 7 of the FPC 6 are extracted, and the connection relationship between the external connection terminal 3 and the FPC wiring line 7 is the same in all lines.

In the present embodiment, as illustrated in FIG. 4, the FPC wiring line 7 is connected to the external connection terminal 3 while extending across both sides of the slit 30. Accordingly, the external connection terminal 3 and the lead-out wiring line 2 function in the same manner as in a case where the external connection terminal 3 and the lead-out wiring line 2 are not divided.

Additionally, as in an enlarged portion indicated by a circle in FIG. 4, even in a case where the touch sensor 4 where both of the pair of slit wiring lines 2a, 2b are barely conductive, that is, the touch sensor 4 (product) is determined as a good product in continuity inspection, and after the inspection, the partial disconnection of only the split wiring line 2b of the pair of split wiring lines 2a, 2b changes to the complete disconnection, the split wiring line 2a of the pair of split wiring lines 2a, 2b still remains, and thus a touch panel function can be maintained.

2. Second Embodiment

In the first embodiment, as illustrated in FIG. 2, the slit 10 extends into the sensor electrode 1 in a range where the slit 10 does not completely divide the sensor electrode 1; however, the touch panel of the present disclosure is not limited to this. For example, a slit 10 need not be present in a sensor electrode 1 (see FIG. 5).

Figure 5:
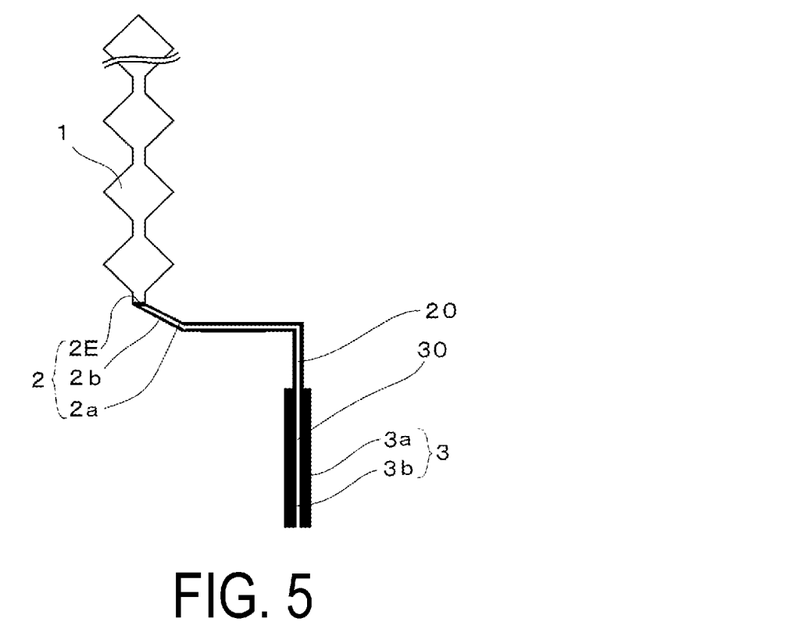
FIG. 5 is a schematic view illustrating another example of a connection state of a lead-out wiring line and an external connection terminal for each sensor electrode in a touch panel according to the present disclosure.

At this time, as illustrated in FIG. 5, an external connection terminal 3 and a lead-out wiring line 2 are more preferably divided continuously by a single slit 20, 30 along the extension direction of the external connection terminal 3 and the lead-out wiring line 2 in a portion of the entire length from which an end portion 2E in a side of the sensor electrode 1 of the lead-out wiring line 2 is excluded. That is, the lead-out wiring line 2 is not completely divided, and is a pair of split wiring lines 2a, 2b connected at the end portion 2E in a side of the sensor electrode 1.

In this way, a difference in a resistance value between the lead-out wiring line 2 having a standard design value and the lead-out wiring line 2 including a mouse bite (a defect of a wiring line chipped along a line as if a mouse bit), that is, the presence or absence of a mouse bite can be detected. Note that the pair of split wiring lines 2a, 2b is connected by the end portion 2E made of the same low resistance material as a material of the split wiring lines 2a, 2b, and thus a resistance value is stable and a mouse bite can be detected. That is, due to the presence of the end portion 2E, detection of a mouse bite is unaffected even when the sensor electrode 1 includes a high resistance material such as ITO.

3. Other Embodiments

Although the first and second embodiments of the present disclosure are described above, the present disclosure is not limited to the above-described embodiments, and various modifications can be made without departing from the scope of the invention. In particular, the plurality of embodiments and modifications described herein can be combined arbitrarily with one another as necessary.

For example, in the above-described embodiments, as illustrated in FIG. 1, the first electrodes (X electrodes) 11 are formed in the front surface side of the substrate 8, and the second electrodes (Y electrodes) 12 are formed in the back surface side of the substrate 8, but the first electrodes and the second electrodes are not limited to this. The first electrodes (X electrodes) 11 and the second electrodes (Y electrodes) 12 may be formed in only one surface of the substrate 8. In this case, an insulating ink film may be formed only at an intersection location of each of the first electrodes (X electrode) 11 and each of the second electrodes (Y electrode) 12, or an insulating ink film may be formed over the entire surface.

Additionally, the first electrode 11 and the second electrode 12 may intersect each other and may not be orthogonal to the X and Y axes.

Figure 6:
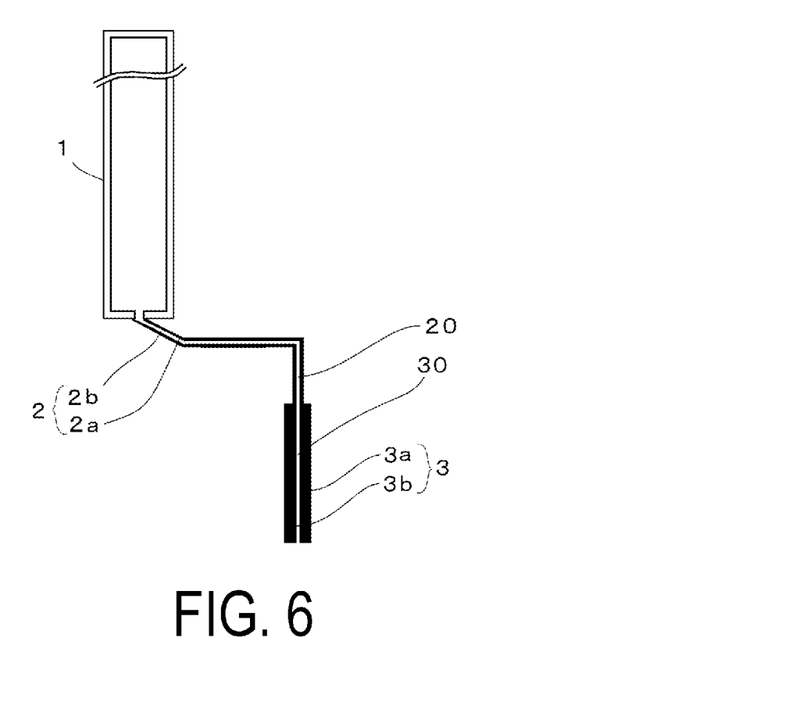
FIG. 6 is a schematic view illustrating another example of a connection state of a lead-out wiring line and an external connection terminal for each sensor electrode in a touch panel according to the present disclosure.

Additionally, in the above-described embodiments, as illustrated in FIG. 1, the sensor electrodes 1 include the plurality of island-shaped electrodes disposed along one direction and the connecting portions connecting the adjacent island-shaped electrodes, but are not limited to this. For example, the sensor electrodes may each be formed in a strip shape. Additionally, as illustrated in FIG. 6, a sensor electrode 1 may be formed in a loop shape, and both ends of the loop may be connected to a pair of split wiring lines 2a, 2b that is independent.

Additionally, in the above-described embodiments, as illustrated in FIG. 1, the external connection terminals 3 are formed in both the surfaces of the substrate 8, but are not limited to this. For example, the external connection terminals 3 may be aggregated in one surface of the substrate 8. In a case where the sensor electrodes 1 are formed in only one surface of the substrate 8, the lead-out wiring lines 2 and the external connection terminals 3 may be formed in the same surface as the sensor electrodes 1. Additionally, in a case where the sensor electrodes 1 are formed in both the surfaces of the substrate 8, through holes for the lead-out wiring lines 2 may be provided in the substrate.

Further, the sensor electrodes 1 need not be formed to intersect each other. For example, the touch panel may be a switch type touch panel that detects only on and off. In this case, the lead-out wiring lines 2 may also be formed in the sensing region S.

Additionally, the touch panel may be a resistive film touch panel.

INDUSTRIAL APPLICABILITY

A touch panel of the present disclosure is useful for an electronic device such as an office automation device, a

BRIEF DESCRIPTION OF THE REFERENCE CHARACTERS

1: Sensor electrode
2: Lead-out wiring line
2a, 2b: Split wiring line
2E: End portion
3: External connection terminal
3a, 3b: Split terminal
4: Touch panel
5: Probe
6: FPC
7: FPC wiring line
8: Substrate
9: Flexible film base material
10, 20, 30: Slit
11: First electrode (X electrode)
12: Second electrode (Y electrode)

The invention claimed is:

1. A touch panel comprising: a substrate having insulating properties and including a sensing region and a non-sensing region around the sensing region; a plurality of sensor electrodes formed in the sensing region; a plurality of external connection terminals formed in the non-sensing region; and a lead-out wiring line electrically connecting one end of each of the plurality of sensor electrodes to each external connection terminal of the plurality of external connection terminals, wherein the external connection terminal and the lead-out wiring line are continuously divided by a single slit along an extension direction of the external connection terminal and the lead-out wiring line in an entire length, or in a portion of the entire length from which an end portion in a sensor electrode side of the lead-out wiring line is excluded.

2. The touch panel according to claim 1, wherein the plurality of sensor electrodes include a plurality of first electrodes extending in a first direction and arranged in a second direction intersecting the first direction, and a plurality of second electrodes extending in the second direction and arranged in the first direction, and each electrode of the plurality of first electrodes is connected to the external connection terminal and the lead-out wiring line, and each electrode of the plurality of second electrodes is connected to the external connection terminal and the lead-out wiring line.

3. The touch panel according to claim 2, wherein the plurality of external connection terminals is formed in only one surface of the substrate.

4. The touch panel according to claim 2, wherein the slit extends into the plurality of sensor electrodes in a range where the slit does not completely divide the plurality of sensor electrodes.

5. A method for inspecting the touch panel according to claim 2, the method comprising:
bringing a probe of a continuity inspection device into contact with each of a pair of split terminals including one of the plurality of external connection terminals divided; and
inspecting continuity between the pair of split terminals via a pair of split wiring lines including the lead-out wiring line divided, and via one of the plurality of sensor electrodes.

6. The touch panel according to claim 1, wherein the plurality of external connection terminals are formed in only one surface of the substrate.

7. The touch panel according to claim 6, wherein the slit extends into the plurality of sensor electrodes in a range where the slit does not completely divide the plurality of sensor electrodes.

8. A method for inspecting the touch panel according to claim 6, the method comprising:
bringing a probe of a continuity inspection device into contact with each of a pair of split terminals including one of the plurality of external connection terminals divided; and
inspecting continuity between the pair of split terminals via a pair of split wiring lines including the lead-out wiring line divided, and via one of the plurality of sensor electrodes.

9. The touch panel according to claim 1, wherein the slit extends into the plurality of sensor electrodes in a range where the slit does not completely divide the plurality of sensor electrodes.

10. A method for inspecting the touch panel according to claim 9, the method comprising:
bringing a probe of a continuity inspection device into contact with each of a pair of split terminals including one of the plurality of external connection terminals divided; and
inspecting continuity between the pair of split terminals via a pair of split wiring lines including the lead-out wiring line divided, and via one of the plurality of sensor electrodes.

11. A method for inspecting the touch panel according to claim 1, the method comprising:
bringing a probe of a continuity inspection device into contact with each of a pair of split terminals including one of the plurality of external connection terminals divided; and
inspecting continuity between the pair of split terminals via a pair of split wiring lines including the lead-out wiring line divided, and via one of the plurality of sensor electrodes.

12. The touch panel according to claim 1, wherein the plurality of external connection terminals are formed in both surfaces of the substrate.

13. A touch panel module comprising: a substrate having insulating properties and including a sensing region and a non-sensing region around the sensing region; a plurality of sensor electrodes formed in the sensing region; a plurality of external connection terminals formed in the non-sensing region; a lead-out wiring line electrically connecting one end of each of the plurality of sensor electrodes to each external connection terminal of the plurality of external connection terminals; and a flexible printed circuit (FPC) crimped with the plurality of external connection terminals and including a plurality of FPC wiring lines, wherein the external connection terminal and the lead-out wiring line are continuously divided by a single slit along an extension direction of the external connection terminal and the lead-out wiring line in an entire length, or in a portion of the entire length from which an end portion in a sensor electrode side of the lead-out wiring line is excluded, and the plurality of FPC wiring lines of the FPC are connected to the plurality of external connection terminals while extending across both sides of the slit.

\* \* \* \* \*